United States Patent [19]

Small

[11] Patent Number: 4,694,389
[45] Date of Patent: Sep. 15, 1987

[54] PROPORTIONAL TRANSISTOR BASE DRIVE CIRCUIT FOR USE IN POWER CONVERTERS AND COMPONENTS THEREOF

[75] Inventor: Kenneth T. Small, Cupertino, Calif.

[73] Assignee: Boschert, Incorporated, Milpitas, Calif.

[21] Appl. No.: 878,938

[22] Filed: Jun. 26, 1986

Related U.S. Application Data

[62] Division of Ser. No. 615,009, May 29, 1984, Pat. No. 4,628,432.

[51] Int. Cl.$^4$ .......................................... H02M 7/5387
[52] U.S. Cl. ...................................... 363/132; 363/98; 336/183; 336/170
[58] Field of Search ........................... 363/17, 98, 132; 336/182–184, 186, 170

[56] References Cited

U.S. PATENT DOCUMENTS

| | | | |
|---|---|---|---|
| 3,195,089 | 7/1965 | Sievers et al. | 336/186 X |
| 3,259,863 | 7/1966 | Russell | 336/184 X |
| 3,818,314 | 6/1974 | Bishop et al. | 363/75 X |
| 3,851,278 | 11/1974 | Isono | 363/133 X |
| 4,007,413 | 2/1977 | Fisher et al. | 363/18 |
| 4,339,792 | 7/1982 | Yasumura et al. | 363/75 |

Primary Examiner—Peter S. Wong
Attorney, Agent, or Firm—Kenneth E. Leeds; Alan H. MacPherson; Paul J. Winters

[57] ABSTRACT

A transformer for use in a power converter includes first and second primary windings tightly coupled to a first secondary winding, and third and fourth primary windings tightly coupled to a second secondary winding. Of importance, the first and second primary windings are only loosely coupled to the third and fourth primary windings. In one embodiment of the invention, the transformer includes a plurality of legs. The first and second primary windings and the first secondry winding are wound around one half of one of the legs but not a secnd half of the one leg. The third and fourth primary windings and the second secondary winding are wound around the second half of the one leg but not the first half. In another embodiment of the invention, the transformer includes a U core. The first and second primary windings and the first secondary winding are wound around a first leg of the U core while the third and fourth primary windings and the second secondary winding are wound around a second leg of the U core.

13 Claims, 12 Drawing Figures

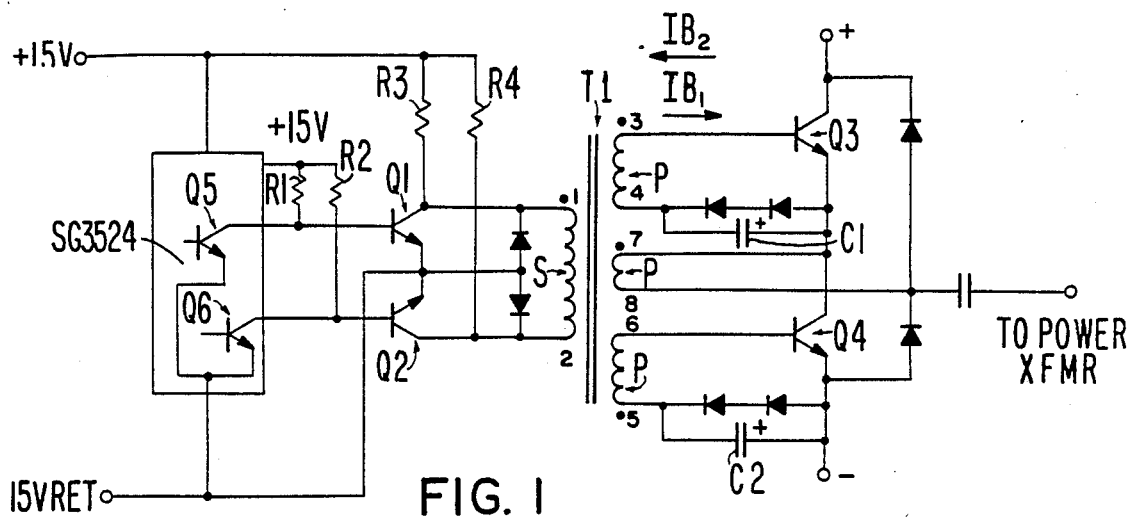
FIG. 1
PRIOR ART
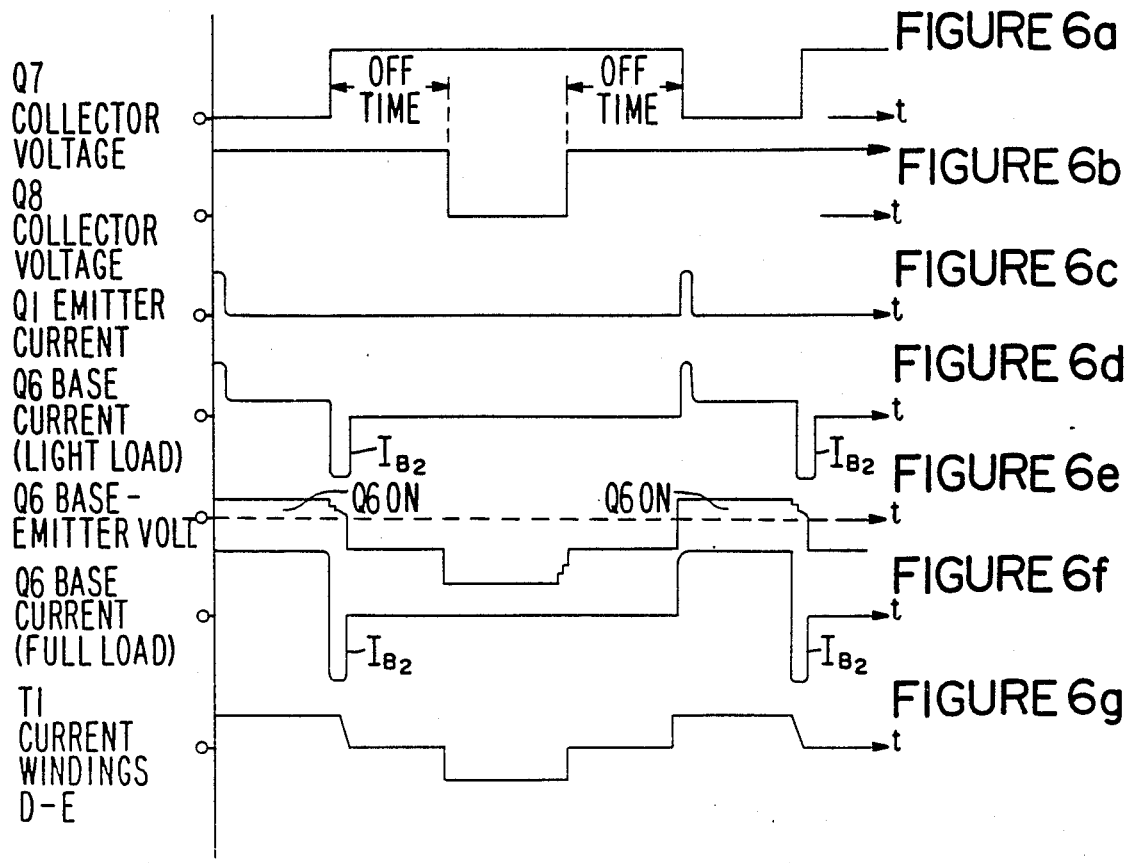

PROPORTIONAL TRANSISTOR BASE DRIVE CIRCUIT FOR USE IN POWER CONVERTERS AND COMPONENTS THEREOF

This application is a division of application Ser. No. 615,009, filed May 29, 1984, now U.S. Pat. No. 4,628,432.

BACKGROUND OF THE INVENTION

1. Field of the Invention

This invention relates to power converters (i.e., devices which convert one D.C. voltage or current to another D.C. voltage or current) and in particular to a power converter employed in a switching power supply and to components thereof.

2. Prior Art

Various push-pull proportional transistor base drive circuits have been successfully used for years in power converters. FIG. 1 illustrates a typical prior art proportional drive circuit for use in such a converter. In the structure of FIG. 1, the emitter current of Q3 causes a current to flow in the load winding (7-8) of T1 which by current transformer action applies a "load proportional" drive current to Q3 base. The termination of this drive condition occurs when Q5 of the regulator turns off and causes Q1 to saturate again. Q2 has remained saturated throughout the off period of Q1.

With Q1 and Q2 saturated, T1 is essentially shorted and Q3 turns off. Also the storage charge in C1 during the forward conduction of Q3 is now applied as an $I_{B2}$ signal (i.e., a current out of the base of Q3 rather than into the base as shown) with a very low source impedance because T1 is shorted. As the $I_{B2}$ pulse decays, Q3 turns off and its base remains reverse biased until $I_{B1}$ is reapplied.

The circuit of FIG. 1 has certain problems in that R3 and R4 do not conduct enough current at low output currents to prevent magnetizing current in T1 from turning off transistors Q3 and Q4, respectively. Since the current in winding 7-8 (which is part of a regenerative feedback circuit) is low at light load, R3 and R4 would have to dissipate an undesirably large amount of power to eliminate this problem. An additional problem is that the circuit of FIG. 1 cannot be used for a full bridge converter of the type shown in FIG. 3 merely by adding another set of paralleled base drive windings such as windings P2 and P4 (FIG. 3). This is because the limited initial base drive will not turn on both parallel power transistors corresponding to Q1 and Q2 or Q3 and Q4 unless they are exactly matched. The transistor which turns on with the lower $V_{BE}$ will accept all the base charge and leave nothing for the other transistor. The circuit will neither start nor switch. This problem is further worsened if the full bridge stops with voltage across two transistors and no voltage across the other two. Thus the converter power switching stage shown in FIG. 3 may stop between turn-on of Q1 and Q2 on the one hand and Q3 and Q4 on the other hand with a different collector-to-emitter voltage across Q1 and Q4 as compared to the collector-to-emitter voltage across both Q2 and Q3. The transistor with the lower voltage (i.e., usually with no collector to emitter voltage across it) will hog the turn on base current and starve the other one, again resulting in no turn on and no switching.

Another problem with the cicuit of FIG. 1 is that transformer T1 isolates the primary P and secondary S circuits and often is designed to stringent product safety standards. In accordance with international safety standards, this requires insulation capable of withstanding 3750 VAC and results in large physical separation between primary and secondary windings. This results in high leakage reactance between primary and secondary windings and relatively tighter coupling between the primary (base) windings. During transistor turn off, ringing of the base waveforms turns on intermittently certain of the transistors Q1, Q2, Q3 and Q4 because the control (secondary) windings are poorly coupled. This results in a momentary short circuit across either Q1 and Q3 and/or Q2 and Q4, wasted power, and reliability problems.

SUMMARY OF THE INVENTION

In accordance with this invention, the above problems are overcome. The failure of R3 and R4 (FIG. 1) to conduct enough current at low output current is overcome by adding a resistor $R_{FB}$ (FIG. 2) from the output transformer (not shown in FIG. 1 but shown in FIG. 2 as T2) to give minimum needed base drive even at zero load (i.e., output current and to prevent dropout (i.e., the turn off prematurely of switching transistors Q5 and/or Q6 (FIG. 2) due to lack of base drive).

The inability of the circuit to be used for a full bridge converter merely by paralleling another set of base drive windings is overcome by the addition of a one microsecond starting edge pulse. This starting pulse drives between one-half and one amp into the base of the transistor Q5 or Q6 (FIG. 2) as appropriate. This pulse lasts for only about one (1) microsecond but insures that paralleled transistors (such as Q1 and Q2 or Q3 and Q4 in FIG. 3) in a full bridge will both be driven on hard. It will also overcome any magnetizing current of T1 that could prevent turn on of Q1, Q2, Q3 or Q4 in FIG. 3 or Q5 or Q6 in FIG. 2. The resulting storage time (2-5 microseconds) is long enough for current and/or voltage feed back in a feedback winding (such as current feedback winding CD and voltage feedback winding DE in FIG. 2) to build to a sufficient level to keep the transistors turned on.

In one embodiment the starting pulse is derived from a current source PNP transistor that is activated by the leading edge of the on signal from a typical control integrated circuit used in a switching power supply by differentiation through a capacitor. In accordance with this invention, addition of a five (5) volt zener diode allows a consistent five (5) volt swing on the capacitor giving consistent start pulses and allows using a slow, high gain and high current NPN turn off darlington transistor by providing 5 volts of negative base voltage. This provides a rapid turn off of the NPN transistor using the small current (50-200 milliamps) typically available from most control integrated circuits.

In accordance with this invention the problem associated with the high leakage reactance of the base drive transformer T1 (in FIG. 1) is solved by winding the base windings corresponding, for example, to windings P1 and P2 (FIG. 3) or to windings P3 and P4 (FIG. 3) so that windings P1 and P2 are physically separated from windings P3 and P4 (for example, on the center leg of an "E" core. The leakage inductance between base windings is increased. Note that P1, P2, P3 and P4 are wound on the same core so that an increase in leakage reduces the inductive coupling of P1 and P2 to P3 and P4. Separate control windings (such as windings S1 and S2 in FIG. 3) may be placed directly over each base winding and connected in parallel. This gives minimal interaction between the two sets of base windings P1 and P2 relative to P3 and P4 without resorting to two separate transformers. The core of T1 is fully utilized and retains equal bi-directional flux excursions.

This invention will be more fully understood in conjunction with the following detailed description taken together with the following drawings:

BRIEF DESCRIPTION OF THE DRAWINGS

FIG. 1 illustrates the power switching stage of a prior art proportional drive power supply;

FIGS. 6a through 6g illustrate waveforms of use in explaining the operation of this invention.

DETAILED DESCRIPTION

Figure 2:
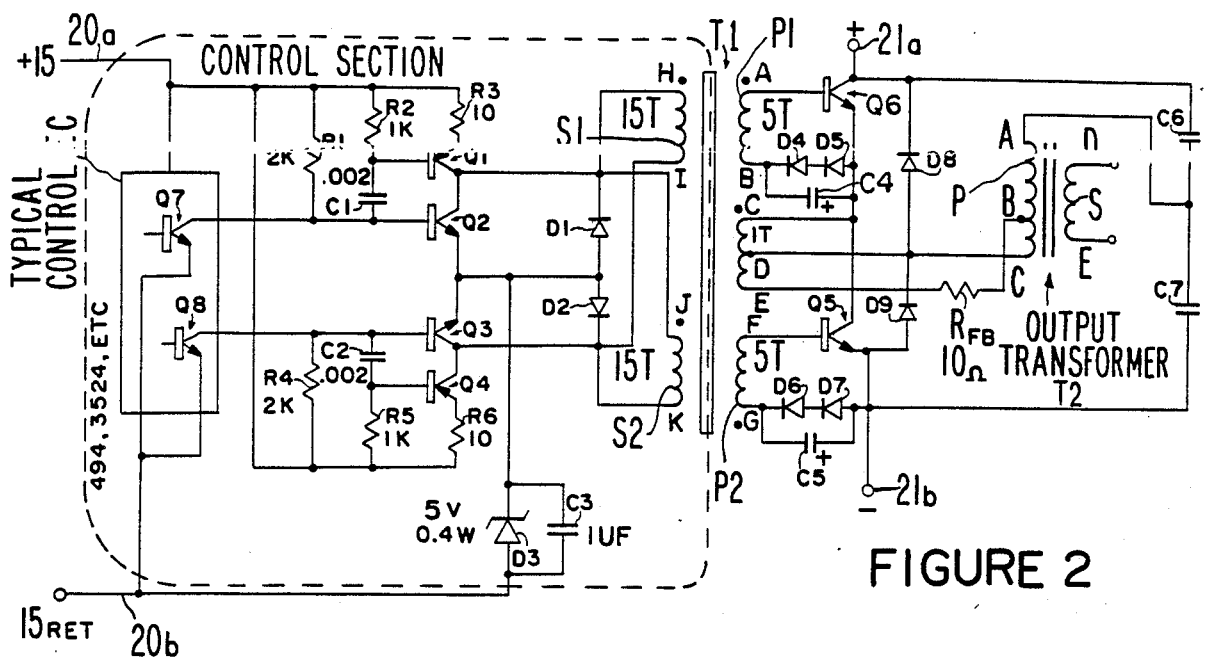
FIG. 2 illustrates an improved power switching stage of a proportional drive power supply in accordance with this invention which overcomes problems with the prior art power switching stage.

FIG. 2 illustrates one embodiment of this invention. In the circuit of FIG. 2 a half bridge power switching circuit is shown; however, a full bridge power switching circuit of the type shown partially in FIG. 3 could equally be used in accordance with the principles of this invention. The invention is therefore not limited to the particular embodiments shown.

In FIG. 2, current (typically 50 mA) flowing from the +15 V housekeeping supply terminal 20a through resistor R1 (2K ohms) and resistor R3 (10 ohms) passes through zener diode D3 which breaks down and clamps at five (5) volts. Capacitor C3 in parallel with diode D3 stores charge at five (5) volts providing reverse base current of Q2 (Q3) enabling rapid turn-off of Q2 (Q3) when Q7 (Q8) respectively turn on.

During off time of both transistors Q6 and Q5 the current through resistors R1 and R4 turns on transistors Q2 and Q3. Diodes D2 and D1 complete the clamping circuit for either polarity voltage across secondaries S1 and S2 of T1. This shorts the secondaries S1 and S2 of T1 (windings H-I, J-K) and through the transformer the primary. Each shorted transformer primary P1 and P2 is coupled to a base winding A-B for Q6, (F-G for Q5) of each switching transistor Q6, Q5. The shorting of primaries P1 and P2 prevents any current in windings C-D or D-E from causing regenerative base currents in transistors Q6 and Q5. Capacitor C4 in parallel with series connected diodes D4 and D5 and capacitor C5 in parallel with series connected diodes D6 and D7 provide a charge reservoir at about 1½ volts to keep transistors Q6, and Q5, respectively, held off and also provide current for the rapid turnoff of Q6 and Q5 when T1 is first shorted.

When transistor Q7 (Q8) turns on, the base to emitter of transistor Q2 (Q3) is reverse biased quickly turning off Q2 (Q3). The negative going signal on the collector of Q7 (Q8) and on the base of Q2 (Q3) is differentiated by C1 (C2) and turns on for 1 or 2 microseconds current source connected transistor Q1 (Q4). The current through Q1 (Q4) flows from the +15 V housekeeping supply through resistor R3 (R6) and the secondary S1 (S2) of T1 through Q3 (Q2) and is returned to ground via the 5 V zener diode D3.

Transformer T1 couples this novel turn on pulse (called the "base blapper") to Q6 (Q5). When Q6 (Q5) turns on, its collector current flows through a one turn current feedback winding C-D on T1. This results in a current equal to one fifth (1/5th) the collector current flowing in the base of Q6 (Q5) due to the current transformer former action of T1 (i.e. the turns ratio of A-B (F-G) to CD is 5 to 1). As a novel feature of this invention, additional base current in Q6 (Q5) is provided by winding D-E in T1. This current is derived from a few turns (winding B-C) across a portion of the primary of output transformer T2. This current is limited by feedback resistor $R_{FB}$ (typically 10 ohms and 5 watts). The feedback current in winding D-E is independent of output load current and is sufficient to overcome T1 magnetizing current which would otherwise steal enough base current from Q6 (Q5) to cause a premature turnoff of Q6 (Q5) at low output load currents and large duty cycles of Q6 and Q5. When Q7 (Q8) turns off, the current from the housekeeping supply terminal 20a through resistor R1 (R4) turns on Q2 (Q3) and rapidly shorts the secondaries S1 and S2 of T1. This results in current being pulled out of the base of Q6 (Q5). When the base charge on Q6 (Q5) is depleted, Q6 (Q5) base current rapidly falls to zero. This generates a rapid voltage change across windings A-B of primaries P1 (P2) (F-G). The loose coupling between windings A-B of primary P1 and F-G of primary P2 prevents this voltage "spike" from turning on Q5 (Q6). Avoiding this turn on eliminates a momentaary short cicuit across the + and −DC bus 21a, 21b which is wasteful of power and can cause overdissipation failure of transistors Q6 and Q5.

Notice that each primary winding (A-B, F-G) on T1 has a tightly coupled control winding (H-I, J-K) which provides rapid turn-on and turn-off of transistors Q6 and Q-5. During turn-off, spikes cannot be transferred from the base of Q6 to the base of Q5 or vice versa through the control windings H-I, J-K due to the solid clamping of transistors Q2 and Q3 which are both fully saturated.

Figure 4:
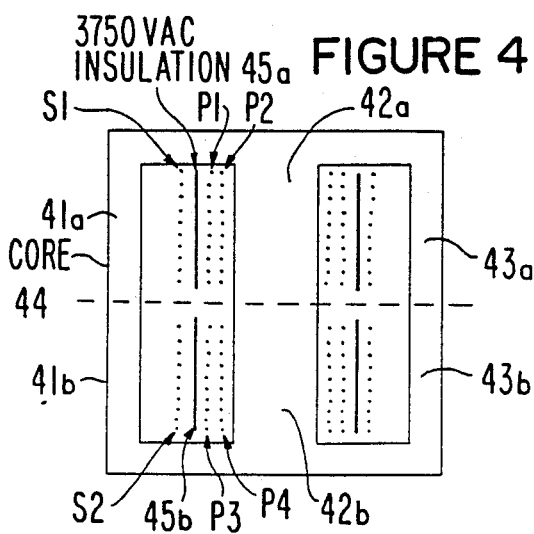
FIG. 4 illustrates the stucture used in accordance with this invention to reduce the coupling in the circuit of FIG. 3 between base windings P1 and P2 on the one hand and P3 and P4 on the other hand (in the case of a full bridge) or between P1 and P2 in the situation where a half bridge (such as shown in FIG. 2) is used with windings P2 and P4 eliminated.
Figure 5:
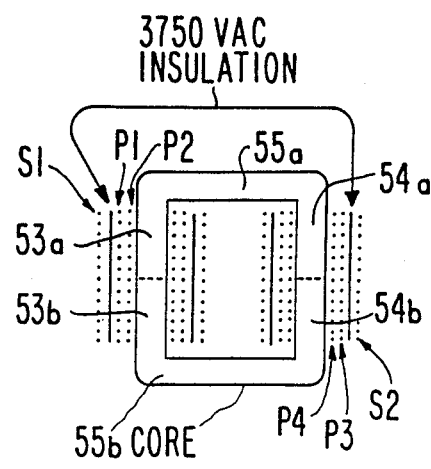
FIG. 5 is an alternate embodiment of the structure of FIG. 4.

FIGS. 4 and 5 show typical physical configurations of windings for transformer T1 needed to obtain the required tight coupling of control winding S1 (S2) with its corresponding primary winding P1 (P2) together with the required loose coupling between windings P1 and P2 used to drive oppositely phased power switch transistors Q6 and Q5, respectively.

Figure 3:
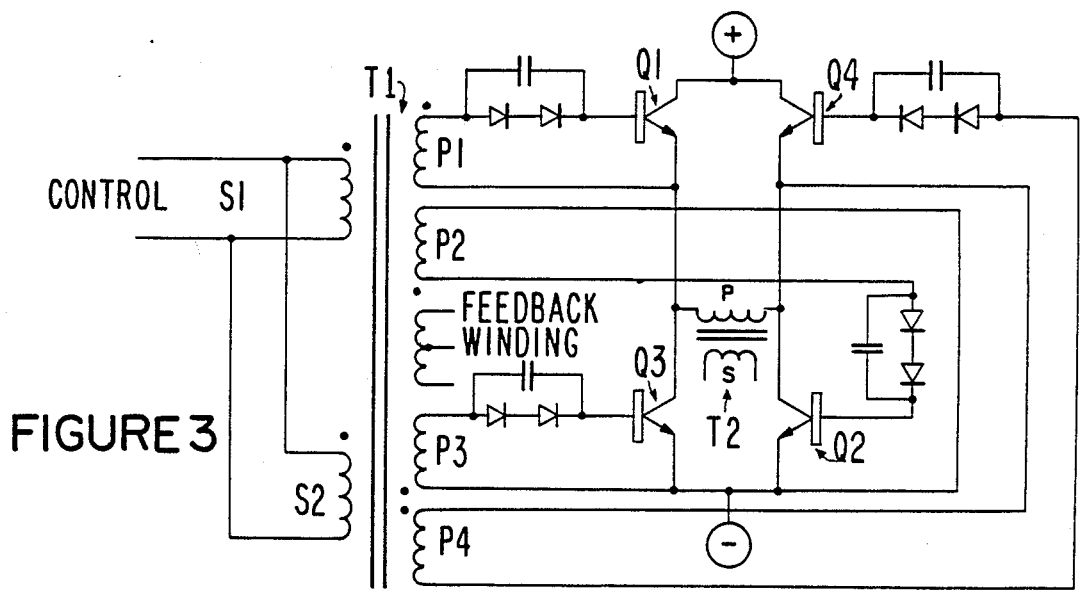
FIG. 3 illustrates a full bridge power switching circuit appropriate for use in accordance with this invention.

The most complicated arrangement for the physical winding corresponding to the full bridge switching ciruit of FIG. 3 is shown in FIG. 4. For a two transistor converter (push pull or half bridge switching circuit as shown in FIG. 2) windings P2 and P4 of FIG. 3 and associated circuitry (for example, transistors Q2 and Q4 in FIG. 3) are eliminated.

In the structure of FIG. 4, primary windings P1 and P2 are wound around center leg 42a of an E core comprising legs 41a, 42a and 43a. Insulation 45a capable of withstanding 3750 volts AC, is then wound around primaries P1 and P2. The primaries P1 and P2, of course, are made of insulated wire. Wrapped around insulation 45a is secondary S1. Insulation 45a is required to allow the transformer to function as an isolation transformer and meet international safety requirements.

On bottom center leg 42b, are wrapped primaries P4 and P3. Then insulation 45b is wrapped around these primaries to serve the same function as does insulation 45a around primaries P1 and P2. Secondary S2 is then wrapped around insulation 45a. The steps used in the manufacture of the structure shown in FIG. 4 are well known and thus will not be described in detail.

FIG. 5 illustrates an alternate construction for the transformer of FIG. 4 wherein center leg 42a, 42b is omitted and primaries P1, P2 are wound around legs 53a, 53b of two U cores while primaries P3 and P4 are wound around legs 54a and 54b of the same two U cores. Insulation capable of withstanding 3750 VAC to meet international safety requirements is then wound around primaries P1, P2 and around primaries P3, P4. Secondary S1 is then wound around the insulation on legs 53a, 53b to complete one portion of transformer T1 while secondary S2 is wound around the insulation on legs 54a, 54b to complete the other portion of transformer T1.

FIGS. 6a through 6g illustrate waveforms of use in explaining the operation of this invention. Thus, FIG. 6a illustrates the collector voltage on transistor Q7 while FIG. 6b illustrates the collector voltage on control transistor Q8. During off times, the collector voltage is relatively high being approximately 6.4 volts above the voltage on return lead 20b of the housekeeping supply for the power converter. During on time, the Q7 collector voltage drops substantially thereby to produce the pulse which turns on the transistor Q1 and thereby turns on transistor Q6 through the base drive pulse through secondary S1 and primary P1 (FIG. 2). FIG. 6C shows the Q1 emitter current during the momentary turn-on of transistor Q1 as a result of the differentiation by capacitor C1 of the negative-going signal on the collector Q7.

FIG. 6d then shows the Q6 base current during light load reflecting the momentary turn on of transistor Q1 as transmitted through secondary S1 to primary P1 (FIG. 2). FIG. 6d also illustrates the reverse base current $I_{B2}$ which results from capacitor C4 sweeping the charge away from the base junction of Q6 during the turn-off of transistor Q6.

FIG. 6e illustrates the base-emitter voltage of transistor Q6 when transistor Q6 turns on while FIG. 6f illustrates the base current on transistor Q6 for a full load being supplied through the primary P of output transformer T2. During this time the regenerative feedback circuit (including resistor $R_{FB}$, the portion B to C of the primary winding P of output transformer T2 and windings D to E of the feedback loop) provides a base drive to transistor Q6 which maintains regeneratively the base current in transistor Q6. Of course, when transistor Q6 is shut off again, the negative base current $I_{B2}$ sweeps the charge from the base of Q6 thereby shutting off transistor Q6.

FIG. 6g illustrates the current through the primary windings DE which generates the voltage feedback applied to the base of Q6 in accordance with this invention. Note that resistor $R_{FB}$ in FIG. 2 functions as a current limiting resistor in the feedback path.

In a full bridge power switching circuit as shown in FIG. 3, diagonal transistors Q1, Q2, for example (or Q3, Q4) that turn on at the same time receive a 1-2 microsecond ½ amp turn-on pulse from the current sources (corresponding to Q1 (Q4) in FIG. 2) in the control circuitry. This pulse is strong enough to overcome differences in the characteristics of transistors Q6 and Q5 (FIG. 2), or difference in the collector voltages of transistors Q1, Q2, Q3 and Q4 in FIG. 3 and insure a solid turn-on of both transistors in each diagonal pair Q1, Q2 (Q3, Q4) (FIG. 3) necessary to prevent skipped power pulses through the primary P of output transformer T2 (FIG. 3) due to a failure to turn on in the regenerative "proportional drive" mode.

While several embodiments of this embodiment has been disclosed, other embodiments will be obvious to those skilled in the design of power switching stages in view of the above disclosure.

I claim:

1. A transformer comprising:
   a core containing a center leg, a first outer leg, a second outer leg, a first cross piece joining a first end of said center leg to a first end of said first outer leg and a first end of said second outer leg, and a second cross piece joining a second end of said center leg with a second end of said first outer leg and a second end of said second outer leg;
   a first primary winding wound around a first portion of said center leg but not a second portion of said center leg;
   a second primary winding wound around said first primary winding;
   first insulation wound around said first primary winding and said second primary winding;
   a first secondary winding wound around said first insulation;
   a third primary winding wound around said second portion of said center leg but not said first portion;
   a fourth primary winding wound around said third primary winding;
   second insulation wound around said third and fourth primary windings; and
   a second secondary winding wound around said second insulation,
   wherein said first and second insulation isolates said primary windings from said secondary windings so as to insure that said transformer meets international safety standards.

2. A circuit including a transformer comprising:
   a first transistor;
   a second transistor;
   a third transistor;
   a fourth transistor;
   at least one U core containing a first leg and a second leg;
   first and second primary windings wound around the first leg of said U core, said first and second primary windings providing base current for said first and second transistors, respectively;
   first insulation wound around said first and second primary windings;
   a first secondary winding wound around said first insulation;
   third and fourth primary windings wound around said second leg of said U core, said third and fourth primary windings providing base current for said third and fourth transistors, respectively;
   second insulation wound around said third and fourth primary windings; and
   a second secondary winding wound around said second insulation,
   wherein said first and second insulation has the property that it electrically isolates said first and second primary windings from said first secondary winding and said third and fourth primary windings from said second secondary winding thereby to insure that said transformer meets international safety standards.

3. A transformer comprising:
a core containing a plurality of legs, each of said legs being coupled together;
a first primary winding wound around a first portion of one of said legs but not a second portion of said one leg;
a first secondary winding wound around said first portion;
a second primary winding wound around said second portion of said one leg but not said first portion; and
a second secondary winding wound around said second portion.

4. The transformer of claim 3 wherein said first primary winding is tightly coupled to said first secondary winding and said second primary winding is tightly coupled to second secondary winding but said first primary winding is loosely coupled to said second primary winding.

5. The transformer of claim 3 further comprising:
a third primary winding wound around said first primary winding, said first secondary winding being wound around said third primary winding; and
a fourth primary winding wound around said second primary winding, said second secondary winding being wound around said fourth primary winding.

6. The transformer of claim 3 wherein said core contains a center leg, a first outer leg, a second outer leg, a first cross piece for joining a first side of said center leg to a first side of said first outer leg and a first side of said second outer leg, and a second cross piece for joining a second side of said center leg to a second side of said first outer leg and a second side of said second outer leg, and wherein said one leg is said center leg.

7. The transformer of claim 3 wherein said transformer is incorporated into a power convertor, said power convertor comprising first and second transistors, said first primary winding providing base current for said first transistor, said second primary winding providing base current for said second transistor.

8. A circuit including first and second transistors and a transformer comprising:
a core containing at least a first leg and a second leg;
a first primary winding wound around the first leg of said core, said first primary winding providing base current to said first transistor;
a first secondary winding wound around said first leg of said core;
a second primary winding wound around the second leg of said core, said second primary winding providing base current to said second transistor; and
a second secondary winding wound around said second leg of said core.

9. The circuit of claim 8 wherein said first primary winding is tightly coupled to said first secondary winding and said second primary winding is tightly coupled to said second secondary winding, but said first primary winding is loosely coupled to said second primary winding so that pulses caused when said first transistor turns off do not cause said second transistor to turn on.

10. The circuit of claim 8 further comprising:
a third primary winding wound around said first leg of said core, said first secondary winding also being wound around said third primary winding; and
a fourth primary winding wound around the second leg of said core, said second secondary winding also being wound around said fourth primary winding.

11. The circuit of claim 8 wherein said core comprises a U core.

12. The circuit of claim 8 wherein said circuit is part of a power convertor.

13. A circuit including a first transistor and a second transistor, said circuit also including a transformer comprising:
a first primary winding providing base current to said first transistor;
a first secondary winding;
a second primary winding for providing base current to said second transistor;
a second secondary winding, said first primary winding being tightly coupled to said first secondary winding, said second primary winding being tightly coupled to said second secondary winding, said first primary winding being loosely coupled to said second primary winding so that pulses caused when said first transistor turns off do not cause said second transistor to turn on.

* * * * *

UNITED STATES PATENT AND TRADEMARK OFFICE
CERTIFICATE OF CORRECTION

PATENT NO. : 4,694,389

DATED : September 15, 1987

INVENTOR(S) : Kenneth T. Small

It is certified that error appears in the above-identified patent and that said Letters Patent is hereby corrected as shown below:

Col. 2, line 22, delete "output" and replace with --output)--.

Col. 3, line 54, delete "A-B for Q6, (F-G for Q5)" and replace with --(A-B for Q6, F-G for Q5)--.

Signed and Sealed this

Tenth Day of May, 1988

Attest:

DONALD J. QUIGG

Attesting Officer

Commissioner of Patents and Trademarks